United States Patent
Yang et al.

(10) Patent No.: US 8,604,817 B2
(45) Date of Patent: Dec. 10, 2013

(54) MEASUREMENT CARD

(75) Inventors: Fu-Sen Yang, Shenzhen (CN); Yun Bai, Shenzhen (CN); Song-Lin Tong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 226 days.

(21) Appl. No.: 13/304,377

(22) Filed: Nov. 24, 2011

(65) Prior Publication Data
US 2013/0063124 A1 Mar. 14, 2013

(30) Foreign Application Priority Data
Sep. 9, 2011 (CN) .......................... 2011 1 0267037

(51) Int. Cl.
*G01R 31/00* (2006.01)
*G01R 1/067* (2006.01)

(52) U.S. Cl.
USPC ................................ 324/756.03; 324/755.01

(58) Field of Classification Search
USPC .......... 324/72, 72.5, 755.01, 756.03, 762.01, 324/762.02, 762.03, 762.04, 762.05, 324/763.01, 761.01
See application file for complete search history.

(56) References Cited

U.S. PATENT DOCUMENTS

| | | | | |
|---|---|---|---|---|
| 4,731,577 A | * | 3/1988 | Logan | 324/750.29 |
| 5,508,629 A | * | 4/1996 | Stewart et al. | 324/750.19 |
| 5,546,405 A | * | 8/1996 | Golla | 714/724 |
| 7,372,288 B2 | * | 5/2008 | Takemoto | 324/762.02 |
| 7,521,947 B2 | * | 4/2009 | Rogers et al. | 324/755.11 |
| 8,310,253 B1 | * | 11/2012 | Mardi et al. | 324/754.01 |
| 2009/0136235 A1 | * | 5/2009 | Suh et al. | 398/135 |

\* cited by examiner

*Primary Examiner* — Hoai-An D Nguyen
(74) *Attorney, Agent, or Firm* — Altis Law Group, Inc.

(57) ABSTRACT

A measurement card includes a circuit board, an edge connector on a bottom edge of the circuit board, a port arranged on the circuit board, and a single-pole double-throw switch for connecting the port to either a first or a second pin of the edge connector to tests the VDDQ and VTT outputs of a memory slot.

2 Claims, 1 Drawing Sheet

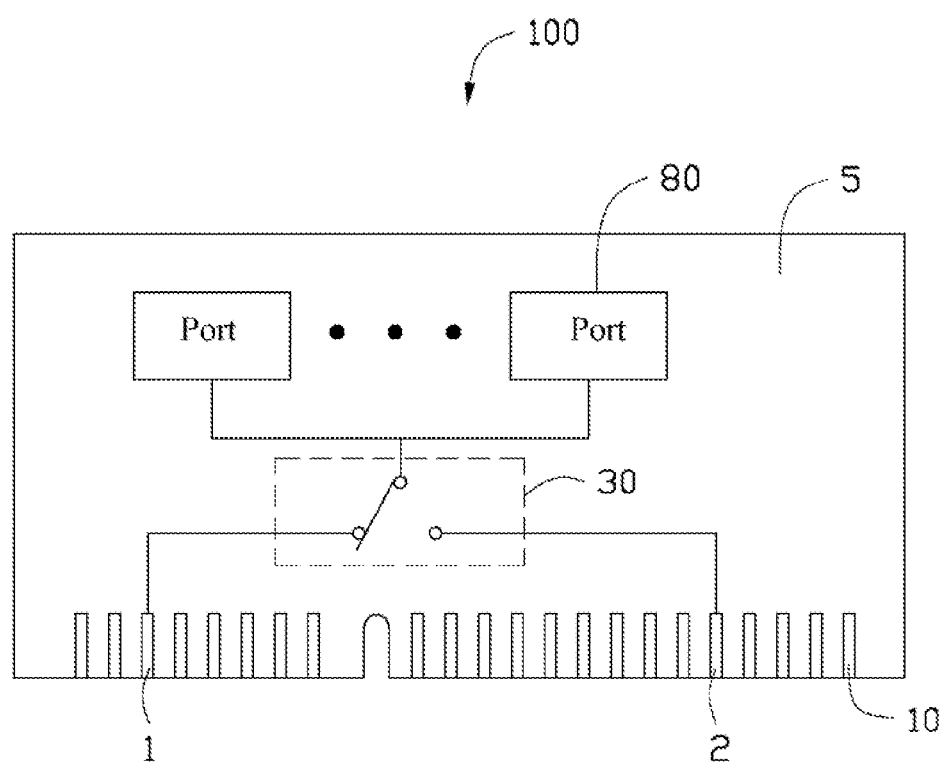

MEASUREMENT CARD

TECHNICAL FIELD

The present disclosure relates to a measurement card.

DESCRIPTION OF RELATED ART

When measuring voltages in computer memories, electronic loads are usually connected between a tester and a memory slot for current limitation. Due to the high density of electronic components in a motherboard, a printed circuit board of the motherboard is often scrapped to expose enough copper for connecting the electronic load to the output terminals of memory slots, which is time-consuming and may damage the motherboard.

BRIEF DESCRIPTION OF THE DRAWING

Many aspects of the embodiments can be better understood with reference to the drawing. The components in the drawing are not necessarily drawn to scale, the emphasis instead being placed upon clearly illustrating the principles of the present embodiments.

The figure is a schematic view of an exemplary embodiment of a measurement card.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Referring to the figure, a measurement card 100 is configured for measuring two series of VDDQ and VTT voltages taken at the output of a memory slot (not shown). An exemplary embodiment of the measurement card 100 includes a circuit board 5, an edge connecter 10 formed on a bottom edge of the circuit board 5, a plurality of ports 80 arranged on the circuit board 5 for connecting electronic loads, and a mechanical single-pole double-throw switch 30 arranged on the circuit board 15.

The edge connector 10 can be engaged in the memory slot. The edge connector 10 includes power pins 1 and 2 for receiving the two series of memory voltages VDDQ and VTT from the memory slot. In this embodiment, the memory slot is a double Data Rate 3 (DDR3) memory slot, and the two voltage pins of the memory slot outputting the voltages VDDQ and VTT are respectively connected to pins 1 and 2 when the measurement card 100 is engaged in the memory slot.

A first terminal of the switch 30 is connected to the ports 80. A first throw of the switch 30 connects to a second terminal of the switch 30, to which the pin 1 is connected, and a second throw of the switch 30 connects to a third terminal of the switch 30, to which the pin 2 is connected. The first terminal of the switch 30 may thus be connected to either the second terminal or to the third terminal of the switch 30. The ports 80 may thus be connected either to the pin 1 or to the pin 2, but not both simultaneously. One of the two pins 1, 2 is connected to the ports 80 at all times. In other embodiments, the switch 30 can be replaced by another switch, such as a two-way slide switch.

In use, the measurement card 100 is engaged in the memory slot by means of the edge connector 10. One or more electronic loads are connected between the ports 80 and a tester for current limitation, and each electronic load is connected to one of the ports 80. The switch 30 may connect to the pin 1 or to the pin 2 to measure the two series of voltages VDDQ and VTT.

The foregoing description of the exemplary embodiments of the disclosure has been presented only for the purposes of illustration and description and is not intended to be exhaustive or to limit the disclosure to the precise forms disclosed. Many modifications and variations are possible. The embodiments are chosen and described in order to explain the principles of the disclosure and their practical application so as to enable those of ordinary skill in the art to utilize the disclosure and various embodiments, with such various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than by the foregoing description and the exemplary embodiments described therein.

What is claimed is:

1. A measurement card for measuring two series of memory voltages, the measurement card comprising:
    a circuit board;
    an edge connector on a bottom edge of the circuit board, the edge connector comprising a first power pin and a second power pin;
    a port arranged on the circuit board; and
    a switch comprising first to third terminals, the first terminal connected to the port, the second terminal connected to the first power pin, the third terminal connected to the second power pin, the first terminal connected either the second terminal or the third terminal 2. The measurement card of claim 1, wherein the switch unit is a single-pole double-throw switch.

* * * * *